US010454247B1

(12) United States Patent
Zayer

(10) Patent No.: US 10,454,247 B1
(45) Date of Patent: Oct. 22, 2019

(54) METHOD OF FORMING A FIBER BRAGG GRATING IN A PRE-ASSEMBLED LASER MODULE

(71) Applicant: II-VI Delaware, Inc., Wilmington, DE (US)

(72) Inventor: Nadhum K. Zayer, Devon (GB)

(73) Assignee: II-VI Delaware, Inc., Wilmington, DE (US)

( * ) Notice: Subject to any disclaimer, the term of this patent is extended or adjusted under 35 U.S.C. 154(b) by 0 days.

(21) Appl. No.: 16/156,372

(22) Filed: Oct. 10, 2018

(51) Int. Cl.
| | |
|---|---|
| *H01S 3/13* | (2006.01) |
| *H01S 5/0687* | (2006.01) |
| *H01S 5/14* | (2006.01) |
| *H01S 5/10* | (2006.01) |
| *H01S 5/00* | (2006.01) |
| *H01S 5/50* | (2006.01) |

(52) U.S. Cl.
CPC .......... *H01S 5/0687* (2013.01); *H01S 5/0078* (2013.01); *H01S 5/1092* (2013.01); *H01S 5/147* (2013.01); *H01S 5/5045* (2013.01); *H01S 5/141* (2013.01); *H01S 5/146* (2013.01)

(58) Field of Classification Search
CPC ...... H01S 5/0687; H01S 5/1092; H01S 5/147; H01S 5/0078; H01S 5/5045; H01S 5/146; H01S 5/141
See application file for complete search history.

(56) References Cited

U.S. PATENT DOCUMENTS

| | | | |
|---|---|---|---|
| 5,914,972 A * | 6/1999 | Siala | G02B 6/0218 372/102 |
| 6,618,405 B2 | 9/2003 | Kimura et al. | |
| 6,778,733 B2 * | 8/2004 | Rothenberg | G03F 1/34 385/37 |
| 7,020,366 B2 | 3/2006 | Nakanishi et al. | |
| 9,735,533 B2 | 8/2017 | Barre et al. | |
| 2002/0130403 A1 | 9/2002 | Onodera et al. | |
| 2003/0021306 A1 * | 1/2003 | Fernald | G02B 6/0218 372/20 |
| 2005/0046928 A1 | 3/2005 | Bischel et al. | |
| 2006/0093012 A1 * | 5/2006 | Singh | G02B 6/02085 372/102 |
| 2017/0031090 A1 * | 2/2017 | Bernier | G02B 6/02138 |
| 2018/0054040 A1 * | 2/2018 | Morton | H01S 5/02415 |
| 2018/0067254 A1 * | 3/2018 | Mihailov | G02B 5/1857 |

OTHER PUBLICATIONS

Singh, Nahar, et al., "Fibre Bragg Grating Writing Using Phase Mask Technology", Journal of Scientific & Industrial Research, vol. 64, Feb. 2005, pp. 108-115.

* cited by examiner

*Primary Examiner* — Kinam Park
(74) *Attorney, Agent, or Firm* — Wendy W. Koba

(57) ABSTRACT

A method of providing a fiber Bragg grating (FBG) within a laser diode package is proposed that includes first inserting the fiber into the package (typically a stripped end termination of the optical fiber) and aligning the fiber with the laser diode. Once aligned, an external FBG writing system is used to illuminate a selected section of the fiber in place in the package (the package remaining "open" at this time) in a manner that creates the specific grating line pattern for a particular FBG. When using a UV-based system with a phase mask, a focusing lens is disposed between the phase and the open package to direct the interfering beams into the core region of the stripped fiber. A high-power femtosecond laser source may be used in an alternative arrangement to directly write the structure and form the in-package FBG.

12 Claims, 3 Drawing Sheets

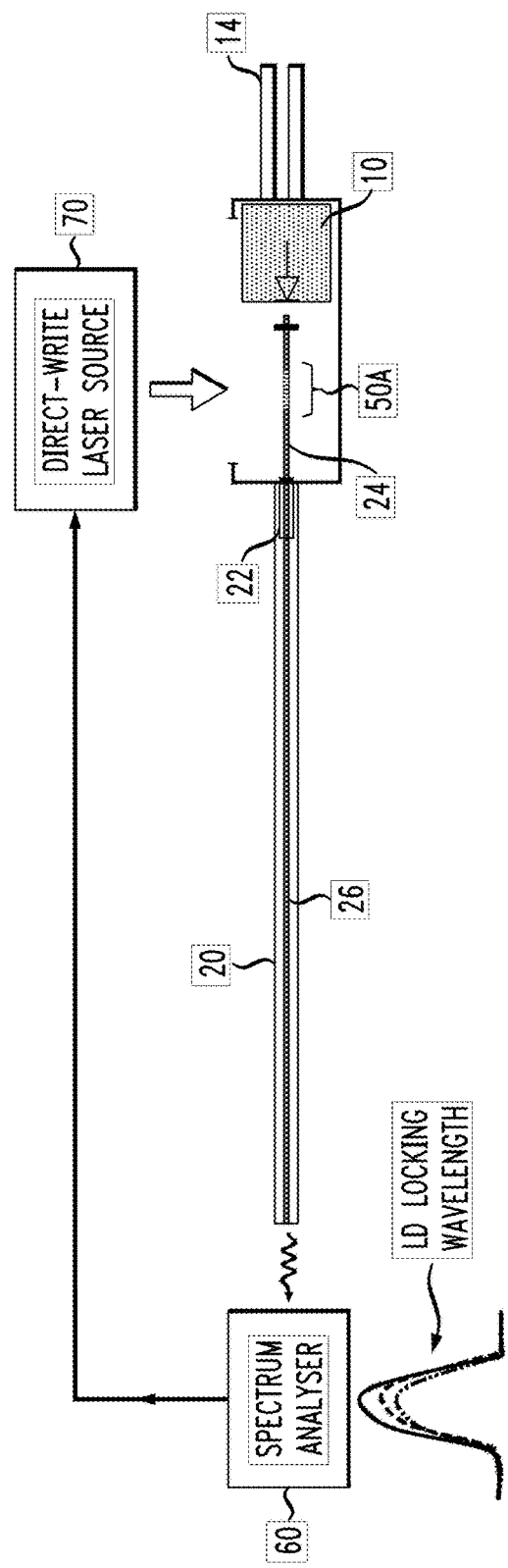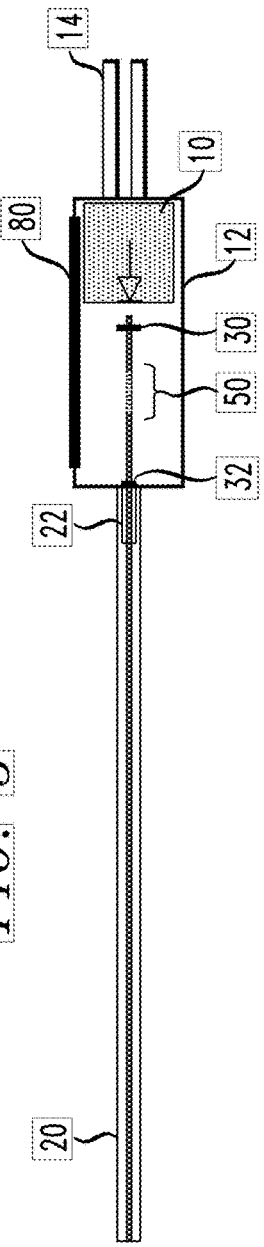

METHOD OF FORMING A FIBER BRAGG GRATING IN A PRE-ASSEMBLED LASER MODULE

TECHNICAL FIELD

The present invention relates to the use of a fiber Bragg grating (FBG) as a wavelength stabilization component in a laser transmitter and, more particularly, to a method of creating an FBG in a fully assembled laser module.

BACKGROUND OF THE INVENTION

Fiber Bragg gratings (FBGs) are well-known elements used in conjunction with laser transmitters as an in-line filter to stabilize the output wavelength produced by the laser. In one application, an FBG is used with a pump laser source to maintain the output wavelength at the desired 980 nm value required for use in an optical amplifier. An FBG basically consists of a longitudinal variation in the refractive index of the core region in an optical fiber, where the variation is normally formed by exposing a section of stripped fiber to a UV source that illuminates the fiber with interfering beams in a manner that modifies the refractive index profile of the core region of the fiber as a function of the beam interference, forming a pattern of alternating sections of different refractive index (i.e., a "grating"). Once the grating is formed, new layers of jacket and coating material need to be re-applied along the stripped area of the fiber to protect the grating.

Throughout these and other processes, the fiber exiting the laser diode package is subjected to an extensive amount of handling, which may lead to further degradation of the long-term reliability/strength of the fiber (especially in situations where the fiber needs to be tightly coiled to comply with integration packaging requirements). The degradation in the long-term reliability is due, at least in part, to defects introduced in the fiber during the course of creating the grating structure.

Conventional methods of accommodating the presence of these defects include the use of special packaging constraints that maintain the portion of the fiber containing the grating in a straight line so that any bend-induced defects are avoided. Alternatively, special packaging can be created that maintains a large bend radius within the section of fiber containing the grating. Given the lengths of fiber associated with these systems, the demands on "special packaging" may be greater than economically feasible for most applications. Moreover, there is an increasing demand to comply with "small form factor" packaging requirements for all optical components, where these requirements do not easily accommodate the use of relatively long lengths of fiber or large radius fiber coils, as common in the prior art, to provide output wavelength stability from laser sources.

SUMMARY OF THE INVENTION

The present invention relates to the utilization of an FBG as a wavelength stabilization element with a laser diode source and, more particularly, to a method of creating an FBG in a fully assembled laser module.

In accordance with one or more embodiments of the present invention, an optical fiber is positioned in place within a package module used to house a laser diode source. A portion of fiber located within the package module is stripped prior to insertion in the package. Once fixed in place, a writing source illuminates a designated section of the stripped in-package fiber and creates the FBG.

In various embodiments of the present invention, the laser diode source is energized during the FBG writing process, with an optical spectrum analyzer used to measure the output signal propagated along the fiber and control the FBG writing process. Alternatively, an external wideband light source may be use to illuminate the fiber during the FBG writing process, with a reflected component of this external illumination directed into the optical spectrum analyzer.

One exemplary embodiment of the present invention takes the form of a method of forming a fiber Bragg grating (FBG) in combination with a pre-assembled laser diode source, the laser diode source disposed in a package. The method includes at least the steps of: (1) inserting a stripped end termination of an optical fiber into the package, the package remaining in an opened configuration without a lid; (2) aligning the optical fiber with the laser diode source and fixing the aligned position of the optical fiber; (3) positioning an FBG writing system over the stripped end termination of the optical fiber; and (4) activating the FBG writing system to imprint a predetermined pattern of grating lines along a selected portion of a core region of the optical fiber, forming an in-package FBG.

Other and further embodiments and aspects of the present invention will become apparent during the course of the following discussion and by reference to the accompanying drawings.

BRIEF DESCRIPTION OF THE DRAWINGS

Referring now to the drawings, where like numerals represent like colors in several views:

FIG. 4 illustrates an alternative method in accordance with the present invention for creating an FBG along an in-package portion of the optical fiber; and FIG. 5 is a simplified diagram of an optical fiber coupled to a packaged laser diode, including an in-package FBG formed in accordance with the present invention.

DETAILED DESCRIPTION

Figure 1:
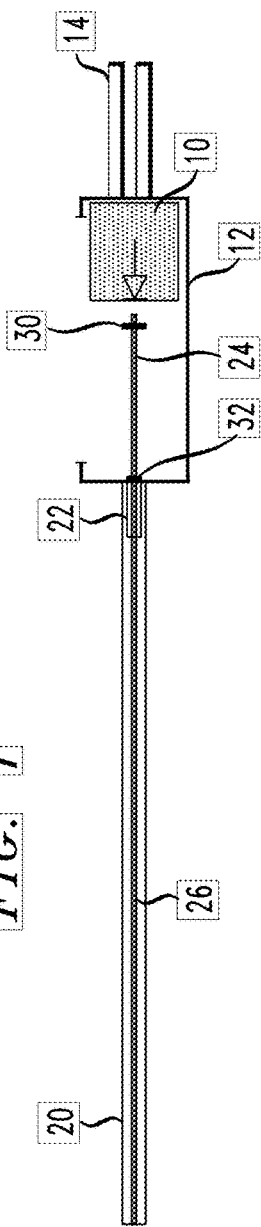
FIG. 1 is a simplified diagram of an optical fiber coupled to a packaged laser diode.

FIG. 1 is a simplified diagram of an initial configuration used for implementing the in-package FBG fabrication method of the present invention. As shown, a laser diode 10 is positioned within a package 12. Electrical contacts 14, used to energize laser diode 10, extend outward from package 12. An optical fiber 20 is shown as attached to package 12, in this case using a ferrule connector 22 to mechanically attach optical fiber 20 to package 12. An end portion 24 of optical fiber 20 is shown as extending into package 12 and positioned in optical alignment with laser diode 10. Prior to insertion, an outer coating material 26 is removed from end portion 24, thus forming a "bare" (also referred to as "stripped") fiber portion. Once aligned, bare fiber 24 is fixed in place within package 12 (using an epoxy or other appropriate bonding material). In the diagram of FIG. 1, a pair of fixing points 30 and 32 is shown.

It is to be understood that up to this point in the process, the components assembled within package 12 have remained visible and accessible to the assembly personnel. That is, the steps described above in association with FIG. 1 are performed without a "lid" being in place on package 12. The next step in the process, as described below, is the formation of an in-package FBG while the interior of package 12 remains exposed. As described above, an FBG is a periodic perturbation of the refractive index along a length of fiber that may be formed, for example, by the exposure of the core to an intense optical interference pattern.

Figure 2:
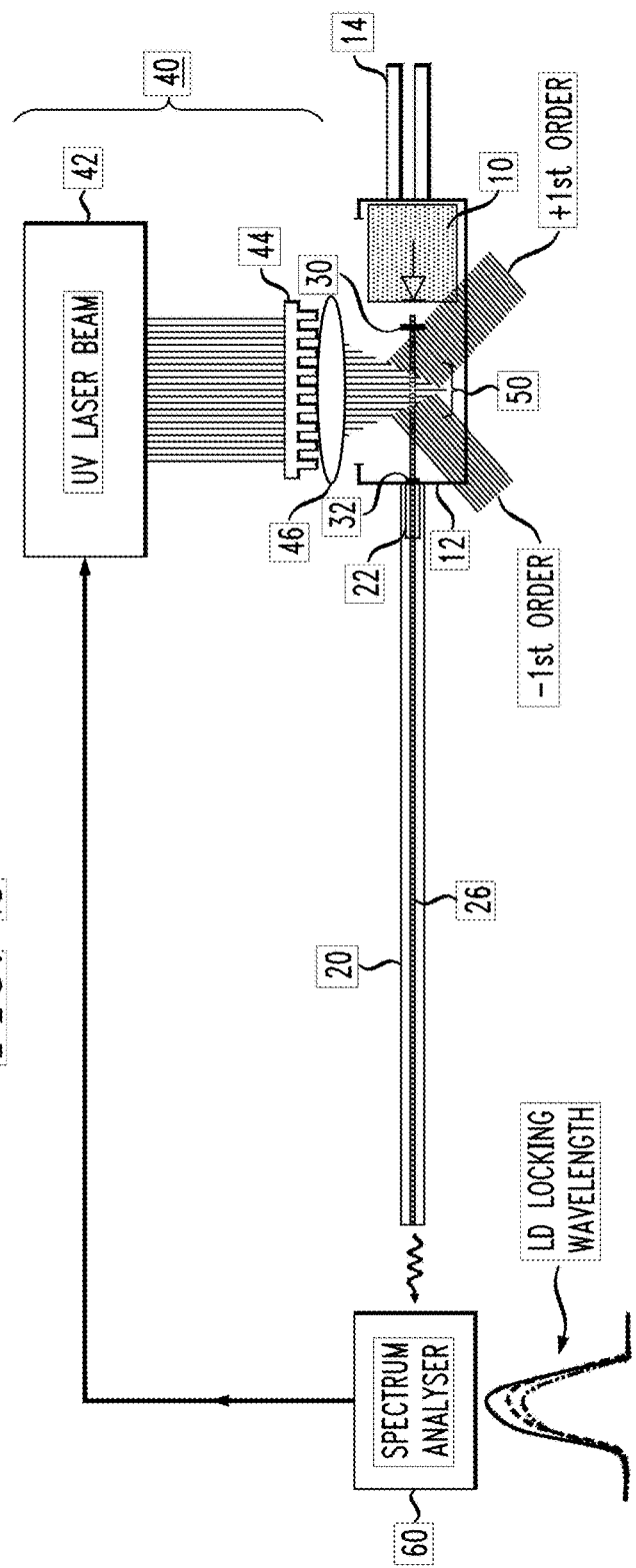
FIG. 2 illustrates an exemplary method of the present invention used for creating an FBG along an in-package portion of the optical fiber.

FIG. 2 illustrates the next step in the in-package FBG formation process, where in this particular embodiment an FBG writing system 40 is positioned over "open" package 12 so as to be disposed above bare fiber 24. In the particular embodiment shown in FIG. 2, FBG writing system 40 includes a UV light source 42, a phase mask 44 and a focusing lens 46. UV light source 42 (which may comprise an ArF excimer laser or a KrF excimer laser, for example) generates a collimated beam which thereafter passes through phase mask 44. Phase mask 44 is specifically designed to introduce controlled phase delays to portions of the collimated beam and create as an output a pair of beams (at a predetermined angle) which will thereafter interfere and create an exemplary pattern of alternating regions of reinforcement and cancellation.

In most conventional prior art arrangements, phase mask 44 is disposed immediately adjacent to the stripped optical fiber. However, in the case of forming an in-package FBG, the phase mask cannot be positioned in relatively close proximity to bare fiber 24. Without any other form of control, the interfering beams would experience a large amount of divergence prior to reaching package 12 and would not be able to create an FBG in the desired location. Therefore, in accordance with the principles of the present invention, focusing lens 46 is used to re-focus the diverging pair of interfering beams and direct the energy onto bare fiber 24 in the position as shown in FIG. 2. The ±first-order beams passing through bare fiber 24 are also shown in this view. It is contemplated that in-package FBG 50 is formed to extend along a relatively small portion of bare fiber 24, for example about 5 mm or so.

The specific intensity of the pattern creates the changes in refractive index of bare fiber 24 necessary to form an FBG 50, as described above. In a preferred embodiment, a feedback configuration may be used to control the operation of system 40 to efficiently control the process of creating the in-package FBG. In an exemplary implementation of the principles of the present invention, the light emitting from laser diode 10 may be used for feedback control. The optical output from laser diode 10 propagates along optical fiber 20, influenced by the changes being introduced by FBG writing system 40. As shown in FIG. 2, an optical spectrum analyzer 60 is disposed to intercept the propagating signal and monitor the characteristics of FBG 50 as it is being created (for example, monitoring the reflectivity and center wavelength of the created grating). The measured characteristics can be used in real time to control the grating writing process. As shown, a control signal is sent from OSA 60 to UV laser 42 and is used to modify the writing process (e.g., adjusting intensity of source, controlling length of exposure, etc.) so that a grating of the desired reflectivity and center wavelength is created.

Figure 3:
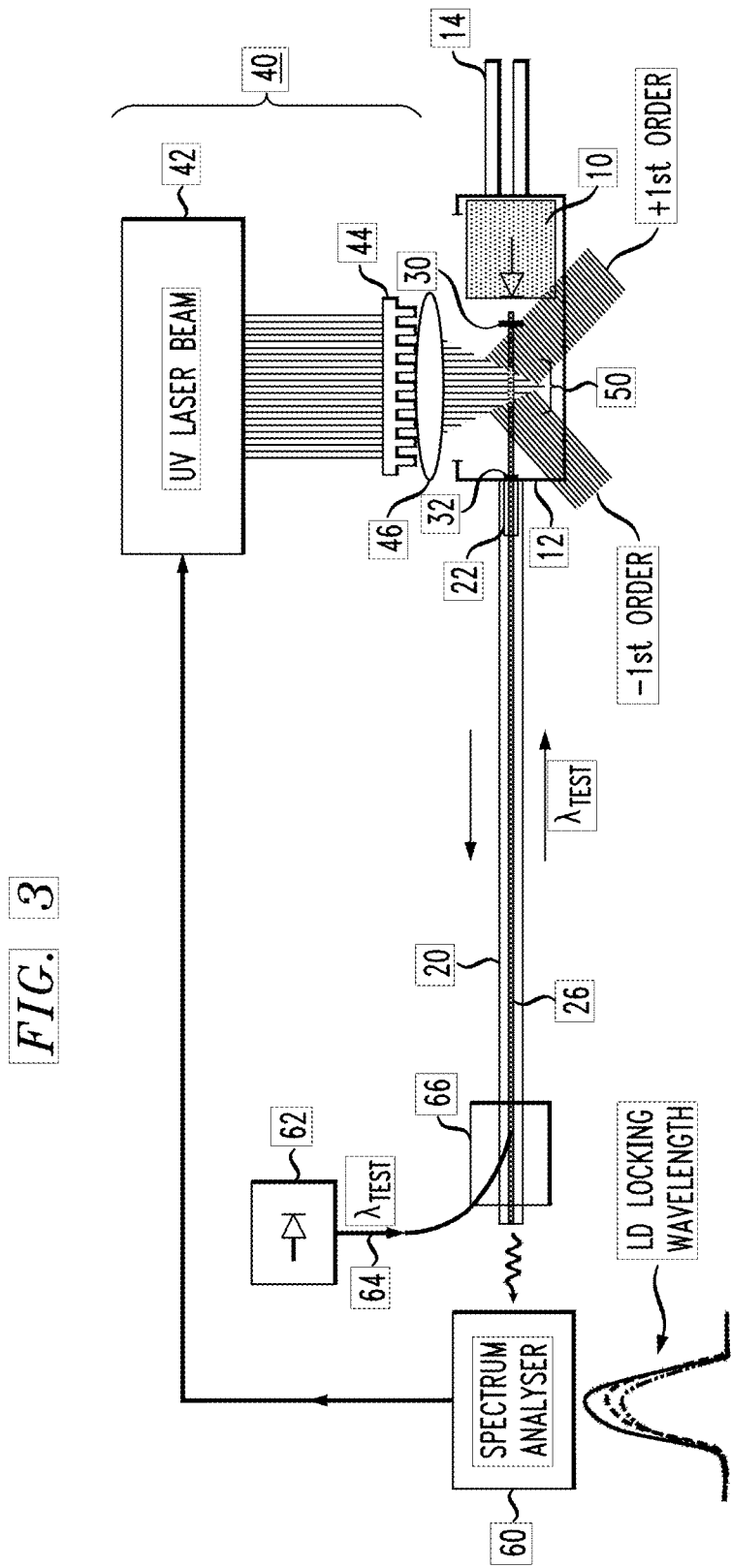
FIG. 3 is an alternative configuration of the embodiment of FIG. 2, in this case using an external light source (and associated coupler) to introduce a test signal into the fiber for use in monitoring the FBG writing process.

It is to be understood that the ability to monitor the grating as it is being written, as well as creating a feedback signal to control the writing process, may utilize an external light source instead of requiring the activation of laser diode 10. FIG. 3 illustrates this configuration, where for the purposes of this example laser diode 10 remains turned "off". Instead, an external light source 62 is used to illuminate bare fiber 24 as the grating is being written. In particular, the optical output from light source 62 is introduced into a section of optical fiber 64, which is applied as a first input to an optical coupler 66 (i.e., a 3 dB coupler), where optical fiber 20 is the other input. The input test signal from light source 62 propagates along the fiber toward package 12, where it ultimately interacts with the grating as it is being written. A reflected portion of this test signal illumination is thereafter directed along the fiber and into OSA 60, to be used in the same manner as discussed above. Advantageously, the use of an external light source allows for a broadband lightwave to be used as the test input signal, which may provide a more detailed characteristic of the FBG response than that associated with passing the emission from (single wavelength) laser diode 10 through FBG 50.

FIG. 4 illustrates an alternative configuration that may be used to create an in-package FBG in accordance with the principles of the present invention. Here, instead of using a light source and phase mask to create an interference pattern that imprints a grating along a defined length of stripped fiber, a femtosecond laser source 70 is used to directly write the desired grating structure onto a portion of bare fiber 24. Femtosecond laser source 70 is a high power, pulsed laser source, with a power in excess of 1000 mJ/cm$^2$, for example. The high power pulses directly interact with the core material (either in a point-by-point, or line-by-line method) to create the desired longitudinal variation in refractive index along a section of fiber. Here, the formed grating is designated as FBG 50A. One advantage of the direct-write method is that it may not require the removal of outer jacket coating 26, since the materials used for this coating are transparent to the near-IR region of the spectrum associated with femtosecond laser source 70. Another advantage is that the grating pattern created within the fiber can be individual tailored for a specific application (e.g., apodized, blazed, chirped, or the like) by controlling the movement of pulses from laser source 70 (it is to be understood that the above-described phase mask writing method may be controlled in a similar manner to provide grating variations, although its implementation is not as straightforward as the direct-write approach).

As with the embodiment shown in FIG. 2, OSA 60 may be used in the same manner in conjunction with femtosecond laser source 70 to control the creation process and produce a grating having the desired reflectivity and central wavelength. Moreover, the direct-write embodiment may use an external light source as a broadband monitoring signal input for use with OSA 60.

FIG. 5 illustrates a final structure, with FBG 50 formed along bare fiber portion 24. Once the process of forming FBG 50 is completed, a lid component 80 is positioned over and attached to package 12.

The invention has been described herein in terms of preferred embodiments. Other embodiments of the invention, including alternatives, modifications, and equivalents of the embodiments described herein, will be apparent to those skilled in the art from consideration of the specification and drawings. The embodiments and preferred features described above should be considered as exemplary only, with the invention being defined by the claims appended hereto, which therefore include all such alternatives, modifications, and equivalents as fall within the true spirit and scope of the present invention.

What is claimed is:

1. A method of forming a fiber Bragg grating (FBG) in combination with a pre-assembled laser diode source, the laser diode source disposed in a package, and the method comprising
- inserting a stripped end termination of an optical fiber into the package, the package remaining in an opened configuration without a lid;
- aligning the optical fiber with the laser diode source and fixing the aligned position of the optical fiber;
- positioning an FBG writing system over the stripped end termination of the optical fiber; and
- activating the FBG writing system to imprint a predetermined pattern of grating lines along a selected portion of a core region of the optical fiber, forming an in-package FBG.

2. The method as defined in claim 1 wherein prior to performing the aligning step, the following step is performed:
- forming a lensed endface at the stripped end termination of the optical fiber.

3. The method as defined in claim 1 wherein the method further comprises the steps of:
- energizing the laser diode source during the step of activating the FBG writing system; and
- measuring an optical signal exiting an opposing end termination of the optical fiber in an optical spectrum analyzer to determine a reflectivity and a created central wavelength of the FBG.

4. The method as defined in claim 3 where the method further comprises the step of:
- transmitting a control signal from the optical spectrum analyzer to the FBG writing system to adjust parameters of the FBG writing system, as need be, to create an in-package FBG exhibiting a predefined reflectivity and center wavelength.

5. The method as defined in claim 1 wherein the method further comprises the steps of:
- introducing an optical test signal along the optical fiber to propagate therealong and interact with the predetermined pattern of grating lines during FBG writing, creating a reflected optical test signal; and
- measuring the reflected optical test signal exiting an opposing end termination of the optical fiber in an optical spectrum analyzer to determine a reflectivity and a created central wavelength of the FBG.

6. The method as defined in claim 5 wherein the method further comprises the step of:
- transmitting a control signal from the optical spectrum analyzer to the FBG writing system to adjust parameters of the FBG writing system, as need be, to create an in-package FBG exhibiting a predefined reflectivity and center wavelength.

7. The method as defined in claim 5 wherein in performing the introducing step an external light source is provided to generate the optical test signal, and the introducing comprises coupling the optical test signal to the optical fiber using an optical coupler.

8. The method as defined in claim 7 wherein the external light source is a broadband light source.

9. The method as defined in claim 1 wherein the FBG writing system comprises a UV-based interference source, and the step of activating the FBG writing system includes the steps of:
- energizing a UV laser source to emit a collimated beam;
- transmitting the collimated beam through a phase mask configured to exhibit a periodic structure associated with a predefined period of the in-package FBG to be formed, the phase mask creating a pair of beams that interfere to create the grating pattern; and
- focusing the pair of interfering beams exiting the phase mask to be directed into the package and illuminate a predefined section of the stripped end termination of the optical fiber and imprint the in-package fiber grating.

10. The method as defined in claim 1 wherein the FBG writing system comprises a high-power femtosecond pulse laser source, and the step of activating the FBG writing system includes the steps of:
- energizing the femtosecond pulse laser source to emit a train of high-power pulses; and
- directing the emitted pulse train onto the stripped end termination of the optical fiber; and
- controlling a movement of the emitted pulse train to directly modify characteristics of a core region of the optical fiber and create the in-package FBG.

11. The method as defined in claim 1 wherein the method further comprises the step of:
- attaching a lid component on the package to encase the in-package FBG with the laser diode source.

12. A method of forming a fiber Bragg grating (FBG) in combination with a pre-assembled laser diode source, the laser diode source disposed in a package, and the method comprising
- inserting an end termination of an optical fiber into the package, the package remaining in an opened configuration without a lid;
- aligning the optical fiber with the laser diode source and fixing the aligned position of the optical fiber;
- positioning an FBG direct-write system over a portion of the optical fiber within the opened package; and
- activating the FBG direct-write system to imprint a predetermined pattern of grating lines along a selected portion of a core region of the optical fiber, forming an in-package FBG.

* * * * *